United States Patent
Lan (10) Patent No.: US 11,137,175 B2
(45) Date of Patent: Oct. 5, 2021

(54) COMPOSITE WATER-COOLING RADIATOR STRUCTURE

(71) Applicant: ASIA VITAL COMPONENTS CO., LTD., New Taipei (TW)

(72) Inventor: Wen-Ji Lan, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 104 days.

(21) Appl. No.: 16/513,689

(22) Filed: Jul. 16, 2019

(65) Prior Publication Data
US 2021/0018229 A1 Jan. 21, 2021

(51) Int. Cl.
*F25B 21/02* (2006.01)
*H05K 7/20* (2006.01)
*G06F 1/20* (2006.01)

(52) U.S. Cl.
CPC ............... *F25B 21/02* (2013.01); *G06F 1/20* (2013.01); *H05K 7/20263* (2013.01); *F25B 2321/0252* (2013.01)

(58) Field of Classification Search
CPC . F25B 2321/02; F25B 21/02; H05K 7/20263; G06F 1/20
See application file for complete search history.

(56) References Cited

U.S. PATENT DOCUMENTS

| | | | | |
|---|---|---|---|---|
| 2,932,953 A * | 4/1960 | Becket | ..................... | H01L 35/30 62/3.6 |
| 3,598,652 A * | 8/1971 | Magladry | ............... | H01L 35/30 376/207 |
| 9,827,580 B2 * | 11/2017 | Yang | ........................ | F25B 19/04 |
| 9,986,632 B2 * | 5/2018 | Shih | ........................... | G06F 1/20 |
| 10,260,781 B2 * | 4/2019 | Lin | ......................... | F25B 21/02 |
| 10,921,067 B2 * | 2/2021 | Lan | ........................... | F28F 1/045 |
| 2003/0136548 A1 * | 7/2003 | Parish | ................. | F28D 15/0275 165/104.21 |
| 2005/0257532 A1 * | 11/2005 | Ikeda | ....................... | F25B 21/02 62/3.7 |
| 2007/0227708 A1 * | 10/2007 | Hom | ........................ | G06F 1/20 165/121 |
| 2008/0043438 A1 * | 2/2008 | Refai-Ahmed | ..... | F28D 15/0233 361/700 |
| 2009/0056679 A1 * | 3/2009 | Masunishi | ........ | H01M 8/04067 123/506 |

(Continued)

*Primary Examiner* — Kun Kai Ma
(74) *Attorney, Agent, or Firm* — Bradley J. Thorson; DeWitt LLP (57) ABSTRACT

A composite water-cooling radiator structure includes at least a cooling plate, a cooling chip unit and a vapor chamber. The cooling plate has a first upper surface and a first lower surface; a liquid flowing section, through which a first working liquid flows; and an inlet and an outlet communicating with the liquid flowing section. The cooling chip unit is located beneath the cooling plate and has a cold end and a hot end; and the cold end is in contact with the first lower surface of the cooling plate. The vapor chamber is located beneath the cooling chip unit and has a second upper surface and a second lower surface; and the second upper surface is in contact with the hot end of the cooling chip unit. With the superposed cooling plate, cooling chip unit and vapor chamber, the composite water-cooling radiator structure provides good heat dissipation effect.

10 Claims, 14 Drawing Sheets

(56) References Cited

U.S. PATENT DOCUMENTS

| | | | | |
|---|---|---|---|---|
| 2012/0085520 A1* | 4/2012 | Pfaffinger | ............. | H01L 23/427 |
| | | | | 165/104.26 |
| 2012/0087088 A1* | 4/2012 | Killion | ...................... | F28F 3/12 |
| | | | | 361/697 |
| 2012/0192574 A1* | 8/2012 | Ghoshal | .............. | F28D 15/0266 |
| | | | | 62/3.2 |
| 2014/0318745 A1* | 10/2014 | Yang | ................... | F28D 15/0275 |
| | | | | 165/104.26 |
| 2015/0000866 A1* | 1/2015 | Lin | ..................... | F28D 15/0233 |
| | | | | 165/67 |
| 2016/0081197 A1* | 3/2016 | Arvelo | .................... | H01L 23/34 |
| | | | | 29/832 |
| 2016/0118317 A1* | 4/2016 | Shedd | ................... | F25B 23/006 |
| | | | | 257/712 |
| 2016/0256922 A1* | 9/2016 | Ii | ........................ | B22D 19/0072 |
| 2016/0262284 A1* | 9/2016 | Ii | ............................ | F28D 1/0477 |
| 2017/0156240 A1* | 6/2017 | Silvennoinen | ..... | H05K 7/20936 |
| 2017/0318710 A1* | 11/2017 | De Bock | ............ | H05K 7/20881 |
| 2018/0031285 A1* | 2/2018 | Thomas | .................. | F25D 17/06 |

\* cited by examiner

COMPOSITE WATER-COOLING RADIATOR STRUCTURE

FIELD OF THE INVENTION

The present invention relates to the field of heat dissipation, and more particular, to a composite water-cooling radiator structure.

BACKGROUND OF THE INVENTION

Many electronic elements in a computer will produce a large quantity of heat when the computer operates. Hence, a good heat dissipation system is a key factor that determines the effectiveness and reliability of a computer. In a computer, the workload of the central processing unit (CPU) and the graphic processing unit (GPU) is higher than any other heat-producing elements in the computer, and accordingly, solutions for dissipating heat produced by the CPU and the GPU are no doubt very important. Particularly, the currently available computer games all include highly exquisite images that require computer-aided design (CAD) software with increasingly enhanced functions to achieve. However, the operation of such CAD software will render the CPU and the GPU into a heavy workload state to produce a huge quantity of heat. Heat accumulated in the computer would result in lowered performance of the CPU and GPU, or, in some worse condition, even result in damages or largely shortened service life of the CPU and GPU.

Figure 1A:
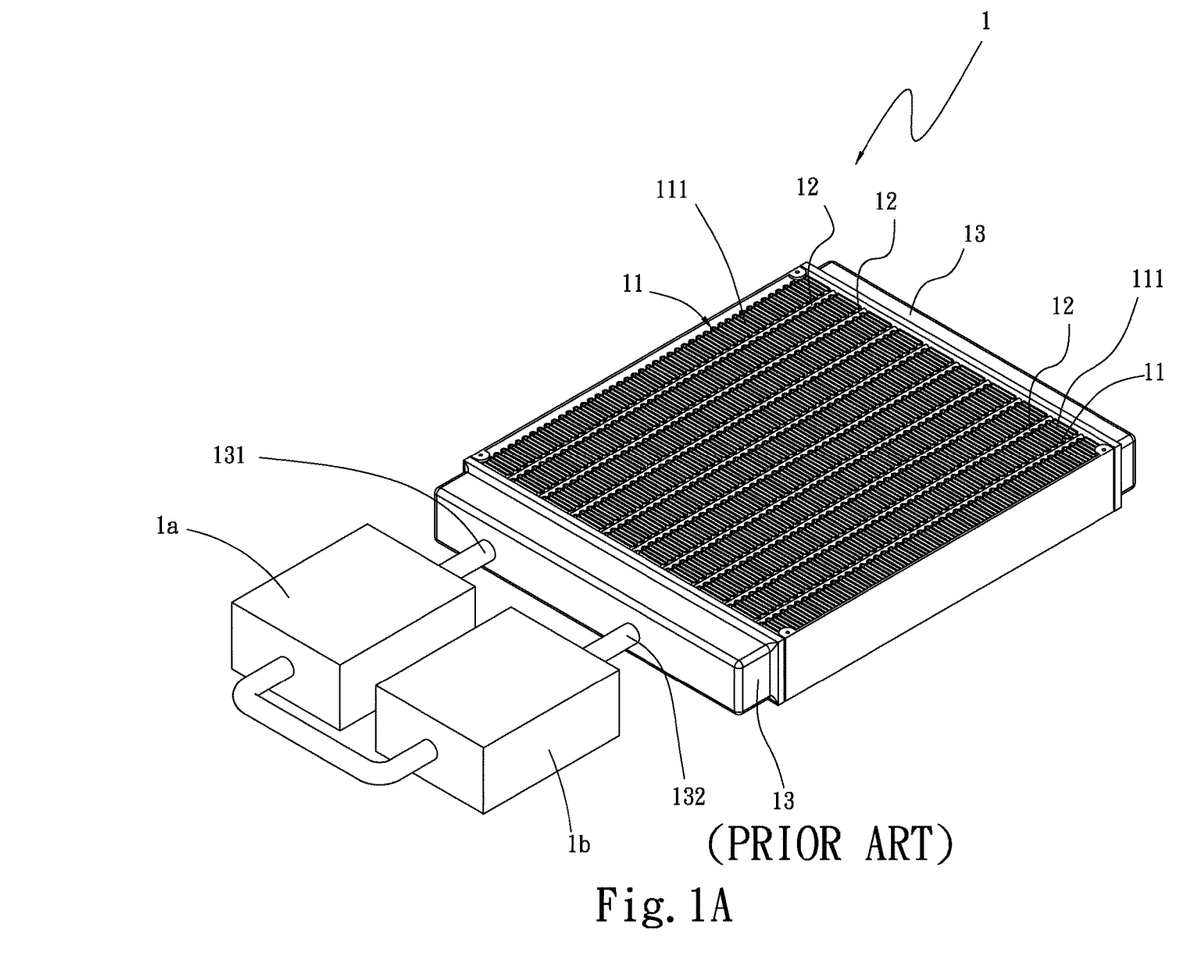
FIGS. 1A and 1B are assembled perspective views of two prior art water-cooling radiators.
Figure 1B:
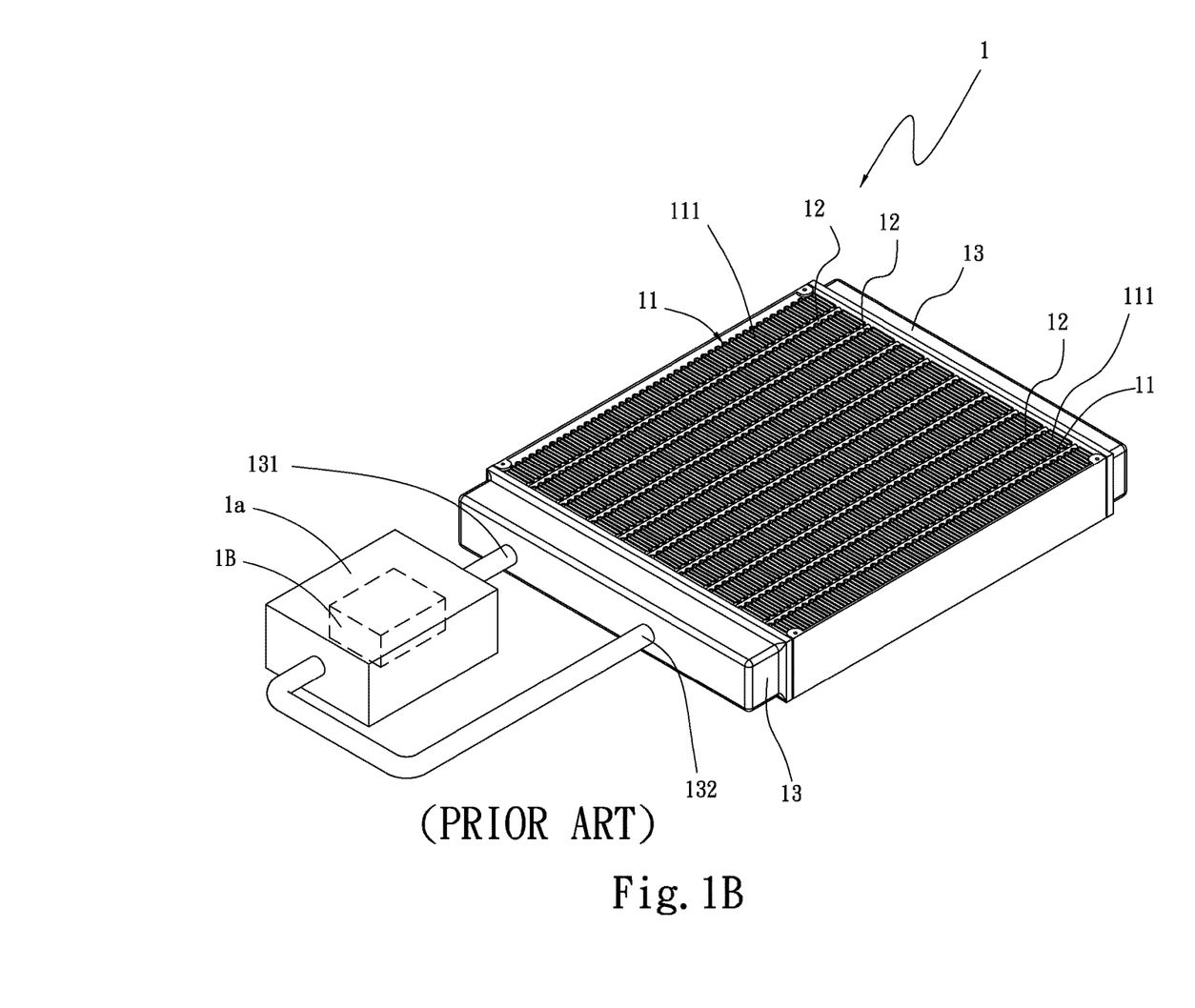

Please refer to FIGS. 1A and 1B that are assembled perspective views of two prior art water-cooling radiators. Different water cooling systems are available in the market for lowering the working temperature of the heat-producing electronic elements. A conventional water cooling system generally includes a water-cooling radiator 1 fluid-communicably connected to a pump 1a and a water block 1b via two water pipes. The water block 1b is in contact with a heat-producing element, such as a CPU. The pump 1a drives a cooling liquid, i.e. a working liquid, from the water block 1b to flow into the water-cooling radiator 1, so that heat absorbed and carried by the working liquid is transferred to and dissipated from the water-cooling radiator 1 into ambient air. The pump 1a drives the cooling liquid to continuously circulate between the water-cooling radiator 1 and the water block 1b to enable quick removal of heat from the heat-producing electronic element. The pump 1a can be provided outside the water block 1b, as shown In FIG. 1A, or inside the water block 1b, as shown in FIG. 1B. The conventional water-cooling radiator 1 includes a plurality of radiation fins 11, a plurality of straight flat pipes 12, and two side water tanks 13. The radiation fins 11 are arranged between any two adjacent flat pipes 12, and the two side water tanks 13 are soldered to the radiation fins 11 and two opposite ends of the flat pipes 12, so that the two side water tanks 13, the radiation fins 11 and the straight flat pipes 12 together constitute the water-cooling radiator 1. A first one of the two side water tanks 13 is provided with a water inlet 131 and a water outlet 132, which are separately connected to the above-mentioned two water pipes (not shown).

The working liquid flowed into the first side water tank 13 via the water inlet 131 quickly and straightly flows through the straight flat pipes 12 to the second side water tank 13, and then quickly flows back to the first side water tank 13 via the straight flat pipes 12 and leaves the water-cooling radiator 1 via the water outlet 132. The conventional water-cooling radiator 1 has a relatively large volume and accordingly, requires a relatively large mounting space in an electronic device. On the other hand, a water-cooling radiator 1 having a reduced overall volume would have lowered heat dissipation efficiency and accordingly, provides poor heat removal performance. It is therefore tried by the inventor to develop a heat dissipation structure that is compact in design and provides high heat dissipation efficiency.

SUMMARY OF THE INVENTION

A primary object of the present invention is to provide a composite water-cooling radiator structure that includes three superposed layers.

Another object of the present invention is to provide a composite water-cooling radiator structure that includes superposed layers and is compact in design to avoid thermal resistance between the superposed layers and accordingly, enable upgraded heat dissipation efficiency.

A further object of the present invention is to provide a composite water-cooling radiator structure that includes three superposed layers, namely, a cooling plate, a cooling chip unit located beneath the cooling plate, and a vapor chamber located beneath the cooling chip unit, so that heat is transferred from the cooling plate via the cooling chip unit to the vapor chamber.

A still further object of the present invention is to provide a composite water-cooling radiator structure that can be optionally provided with at least one radiation fin assembly to thereby have increased air contact area and accordingly, upgraded heat dissipation efficiency.

To achieve the above and other objects, the composite water-cooling radiator structure provided according to a preferred embodiment of the present invention includes a cooling plate, a cooling chip unit and a vapor chamber. The cooling plate has a first upper surface and a first lower surface; a liquid flowing section, through which a first working liquid flows; and an inlet and an outlet communicating with the liquid flowing section. The cooling chip unit is located beneath the cooling plate and has a cold end and a hot end; and the cold end is in contact with the first lower surface of the cooling plate. The vapor chamber is located beneath the cooling chip unit and has a second upper surface and a second lower surface; and the second upper surface is in contact with the hot end of the cooling chip unit.

In an operable embodiment of the present invention, the first upper surface and the first lower surface of the cooling plate are located at two opposite sides of the cooling plate, and one of the first upper surface and the first lower surface is formed with a groove, in which the liquid flowing section is set.

In an operable embodiment of the present invention, the liquid flowing section is a liquid guide pipe having two ends that form the inlet and the outlet, respectively.

In an operable embodiment of the present invention, the cooling plate includes a first upper plate member and a first lower plate member, which are closed to each other. The first upper surface is formed on the first upper plate member and the first lower surface is formed on the first lower plate member; and the liquid flowing section is a guide groove formed between the first upper plate member and the first lower plate member, and has two ends that form the inlet and the outlet, respectively.

In an operable embodiment of the present invention, the cooling chip unit includes one or more cooling chips, which are arranged side by side in a row.

In an operable embodiment of the present invention, the inlet and the outlet are connected to a water block module, which includes a water block and a pump.

In an operable embodiment of the present invention, the cooling plate is provided on the first upper surface with a first radiation fin assembly and the vapor chamber is provided on the second lower surface with a second radiation fin assembly.

In an operable embodiment of the present invention, the vapor chamber internally has a closed chamber for receiving a second working liquid and a wick structural layer therein; and the wick structural layer is situated on one inner wall surface of the closed chamber. Further, the closed chamber is internally provided with at least one supporting post.

In an operable embodiment of the present invention, the first and the second radiation fin assembly are connected to a protection cover unit, which is also connected to at least one cooling fan.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings. For the purpose of easy to understand, elements that are the same in the preferred embodiments are denoted by the same reference numerals.

Figure 2A:
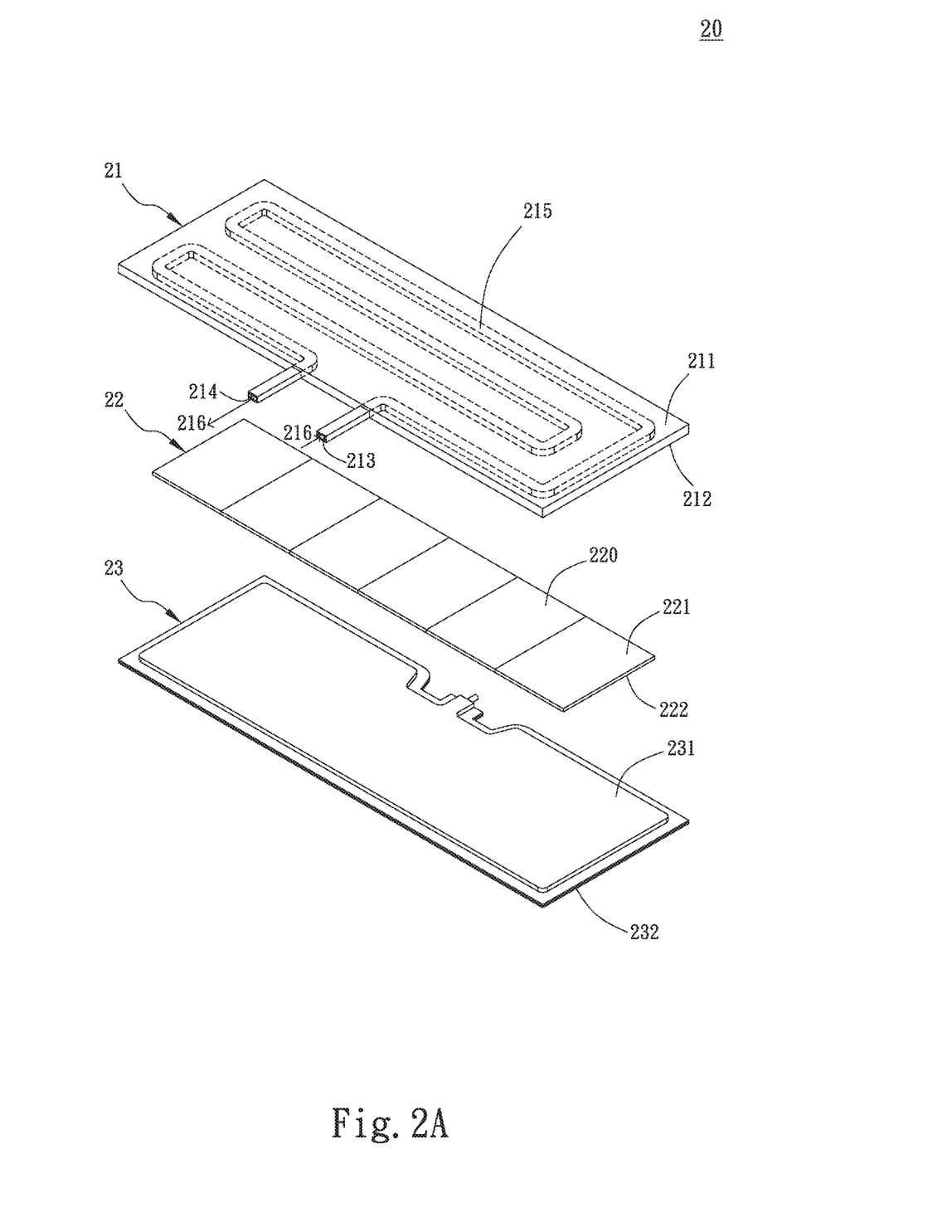
FIG. 2A is an exploded perspective view showing a composite water-cooling radiator structure according to a preferred embodiment of the present invention includes a cooling plate, a cooling chip unit and a vapor chamber superposed from top to bottom.
Figure 2B:
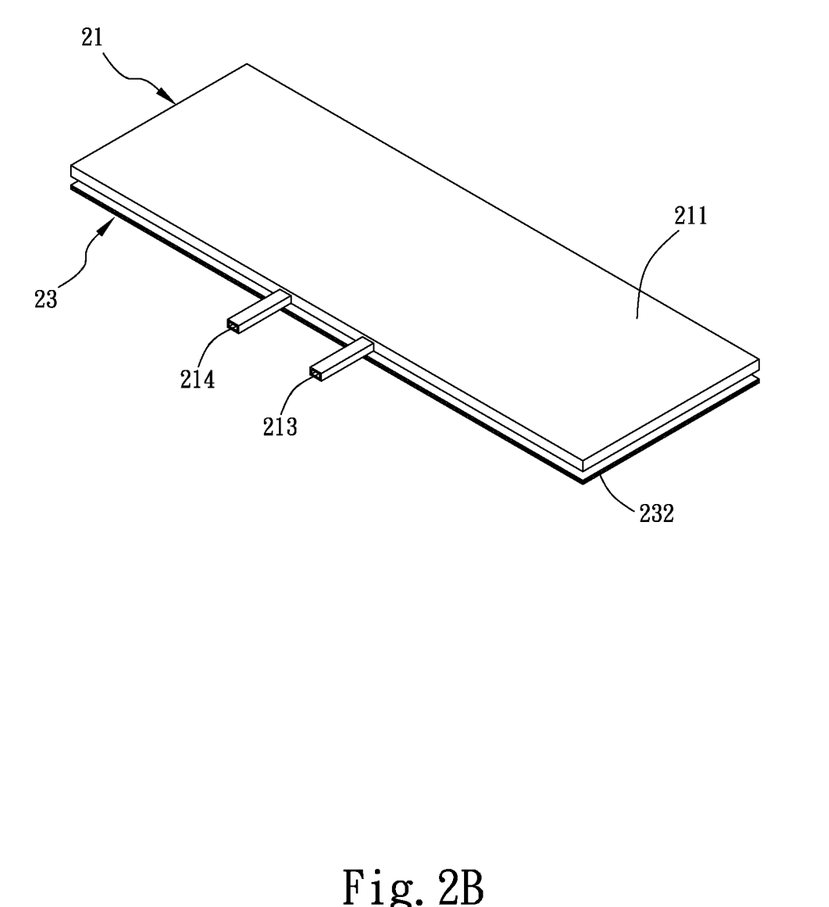
FIG. 2B is an assembled view of FIG. 2A.

Please refer to FIGS. 2A and 2B, which are exploded and assembled perspective views, respectively, of a composite water-cooling radiator structure 20 according to a preferred embodiment of the present invention. As shown, the composite water-cooling radiator structure 20 includes a cooling plate 21, a cooling chip unit 22 and a vapor chamber 23 superposed from top to bottom. The cooling plate 21 includes a first upper surface 211 and a first lower surface 212 located at two opposite sides of the cooling plate 21, a liquid flowing section 215 located between the first upper and lower surfaces 211, 212, and an inlet 213 and an outlet 214 communicating with the liquid flowing section 215 for guiding a first working liquid 216, such as pure water, to flow through the liquid flowing section 215.

The cooling chip unit 22 is located beneath the cooling plate 21. Two opposite sides of the cooling chip unit 22 will form a cold end (or a heat-absorbing surface) 221 and a hot end (or a heat-dissipating surface) 222 when being supplied with an electric current. The cold end 221 is in contact with the first lower surface 212 of the cooling plate 21. The cooling chip unit 22 includes one or more cooling chips 220, which are arranged side by side in a row. In the illustrated preferred embodiment, there are shown six pieces of cooling chips 220 arranged side by side. However, it is understood the quantity of the cooling chips 220 is not limited to six but can be determined by a user according to actual need, such as the areas of the cooling plate 21 and the vapor chamber 23.

Figure 2C:
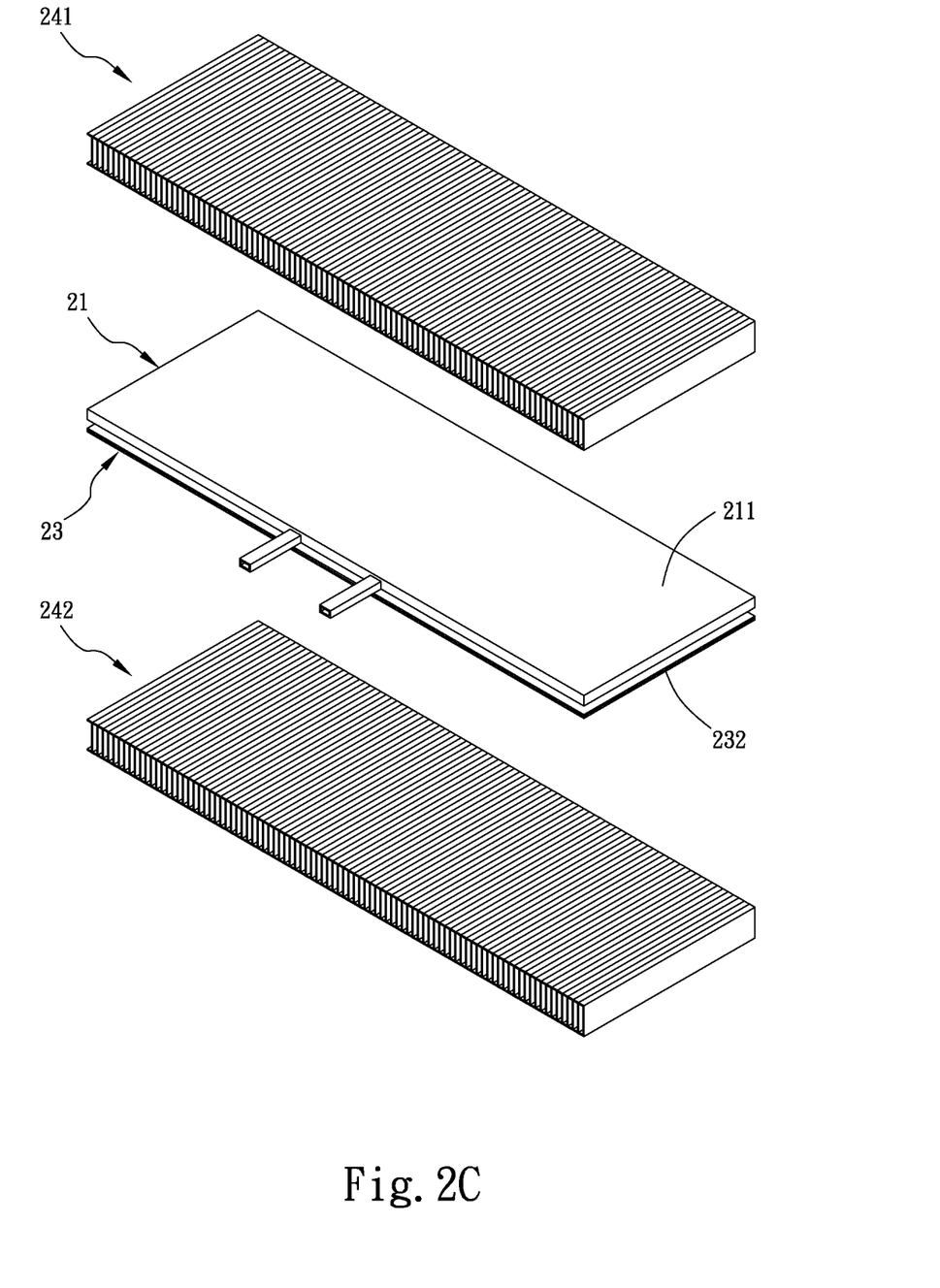
FIG. 2C is an exploded perspective view showing a composite water-cooling radiator structure according to an alternative embodiment of the present invention not only includes a cooling plate, a cooling chip unit and a vapor chamber superposed from top to bottom, but also a first and a second radiation fin assembly provided on the cooling plate and the vapor chamber, respectively.
Figure 2D:
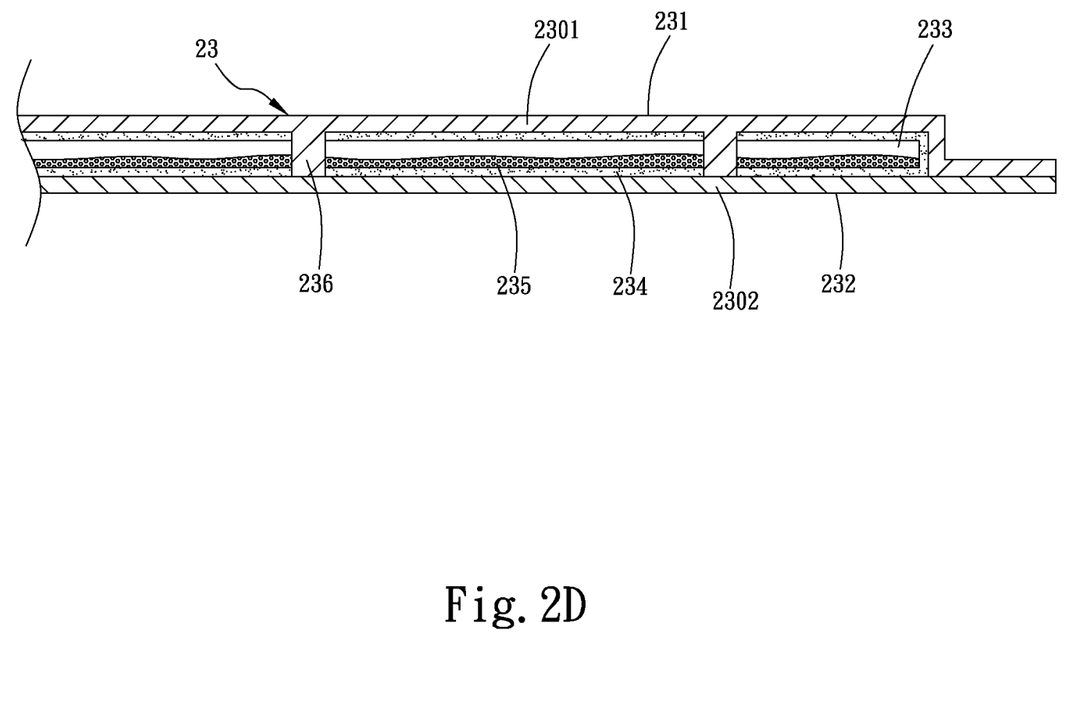
FIG. 2D is a fragmentary sectional view of the vapor chamber according to the preferred embodiment of the present invention.

The vapor chamber 23 is located beneath the cooling chip unit 22, and is formed of two plate members 2301, 2302 that are closed to each other to provide an integrated vapor chamber 23, as shown in FIG. 2D. The vapor chamber 23 defines a second upper surface 231 and a second lower surface 232, which are located at outer sides of the two plate members 2301, 2302, respectively. The second upper surface 231 is in contact with the hot end 222 of the cooling chip unit 22. As show in FIG. 2D, the vapor chamber 23 internally has a closed chamber 233 formed between the two plate members 2301, 2302 for receiving a second working liquid 235 and a wick structural layer 234 therein. The second working liquid 235 can be, for example, one of pure water, methanol, acetone, refrigerant and ammonia without being particularly limited to any specific type of liquid. The wick structural layer 234 is situated on one inner wall surface of the closed chamber 233. The closed chamber 233 can be internally optionally provided with at least one supporting post 236, such that the supporting post 236 is perpendicularly extended between the two plate members 2301, 2302 to support the closed chamber 233. The vapor chamber 23 is a type of two-dimensional heat-transfer element. More specifically, the second working liquid 235 circulates in the closed chamber 233 to change between a vapor and a liquid phase, so that heat transferred from the cooling chip unit 22 to the vapor chamber 23 is quickly distributed over a large area and forms a surface heat source. In this way, the amount of heat transferred in a unit area is reduced to eliminate the problem of hot spot (heat concentration). A relatively large contact area between the vapor camber 23 and the cooling chip unit 22 not only enables good homogeneous temperature effect, but also directly reduces an overall thermal resistance of the composite water-cooling radiator structure 20 of the present invention.

Please refer to FIG. 2C, which is an exploded perspective view showing a composite water-cooling radiator structure according to an alternative embodiment of the present invention. As shown, in the alternative embodiment, the cooling plate 21 is provided on the first upper surface 211 with a first radiation fin assembly 241, and the vapor chamber 23 is provided on the second lower surface 232 with a second radiation fin assembly 242. The first and the second radiation fin assembly 241, 242 provide increased air contact area of the first upper surface 211 and the second lower surface 232, respectively, to facilitate good heat dissipation from the composite water-cooling radiator structure 20 into ambient air.

Figure 3A:
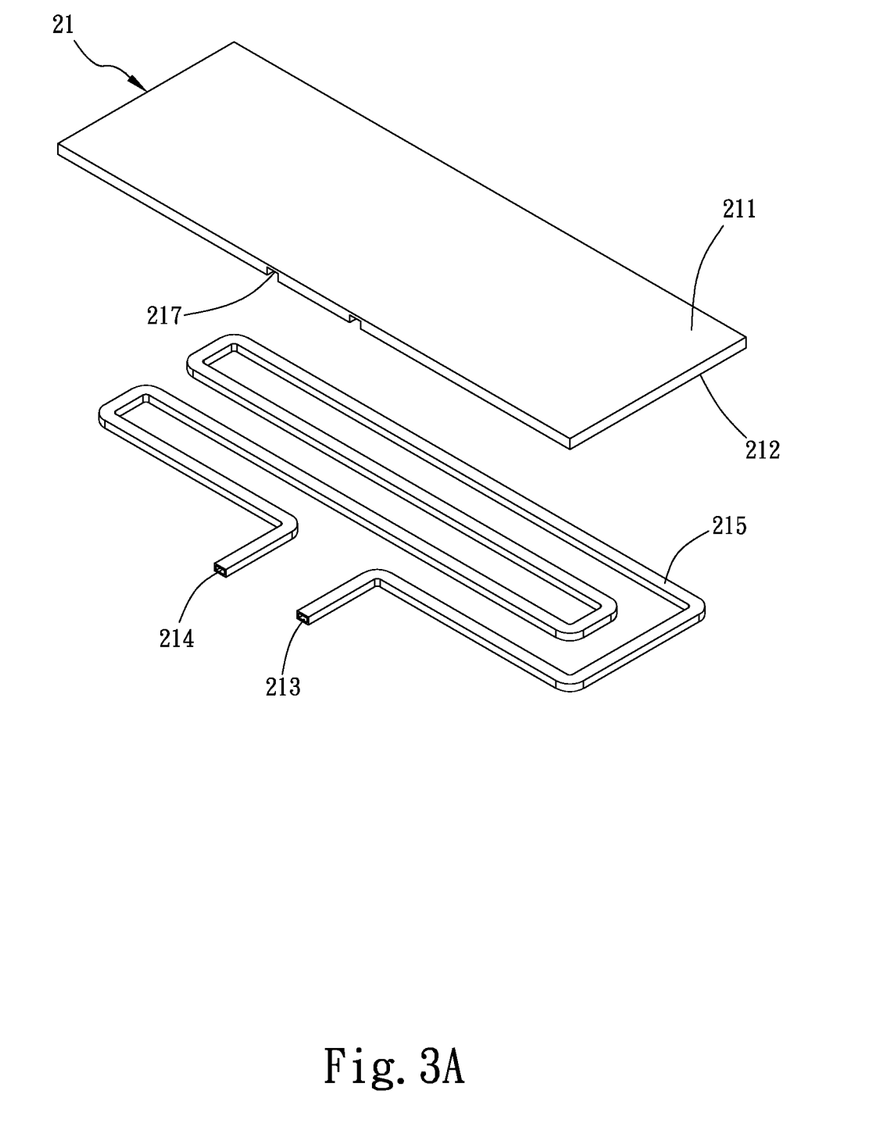
FIG. 3A is a top exploded perspective view of the cooling plate according to the preferred embodiment of the present invention.
Figure 3B:
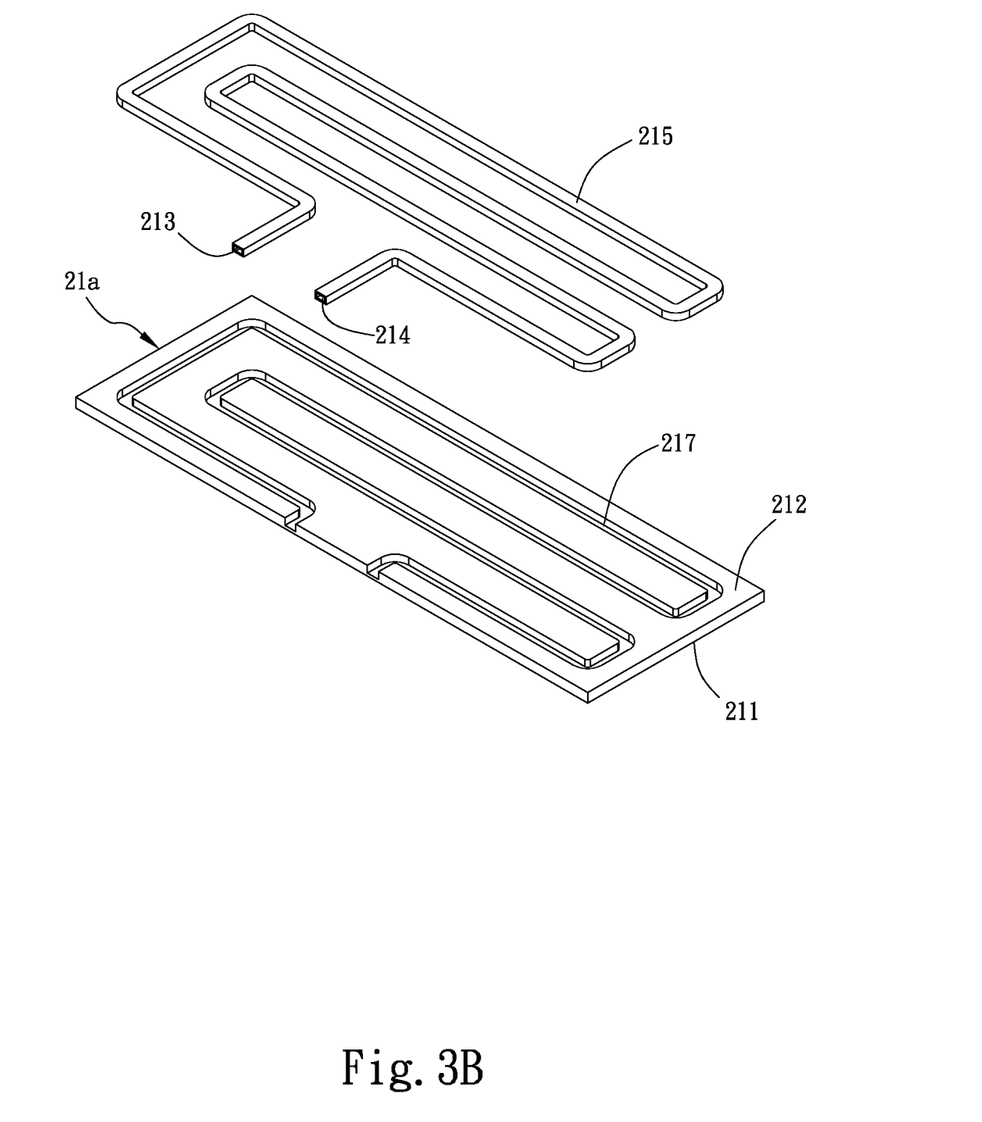
FIG. 3B is a bottom exploded perspective view of the cooling plate according to the preferred embodiment of the present invention.

Please refer to FIGS. 3A and 3B, which are top and bottom exploded perspective views, respectively, of the cooling plate according to the preferred embodiment of the present invention. As shown, in the preferred embodiment, the cooling plate 21 is a plate with good heat conducting ability and is formed on the first upper surface 211 or the first lower surface 212 with a groove 217, in which the liquid flowing section 215 is set. In the illustrated preferred embodiment, the groove 217 is formed on the first lower surface 212 to wind therethrough and accordingly, distribute over the entire first lower surface 212. In the preferred embodiment, the liquid flowing section 215 is a liquid guide pipe embedded in the groove 217 without protruding from the first lower surface 212. In other words, one side of the liquid flowing section 215 opposing the groove 217 is coplanar with the first lower surface 212. Further, the liquid guide pipe has two ends that form the inlet 213 and the outlet 214, respectively. The liquid flowing section 215 is so configured that it matches the winding groove 217 to extend through and distribute over the entire first lower surface 212. With the winding liquid flowing section 215, the time the first working liquid 216 flows through the liquid flowing section 215 is extended, which allows heat carried by the first working liquid 216 to be uniformly transferred to the cooling plate 21 and accordingly, enables good homogeneous temperature effect.

Figure 3C:
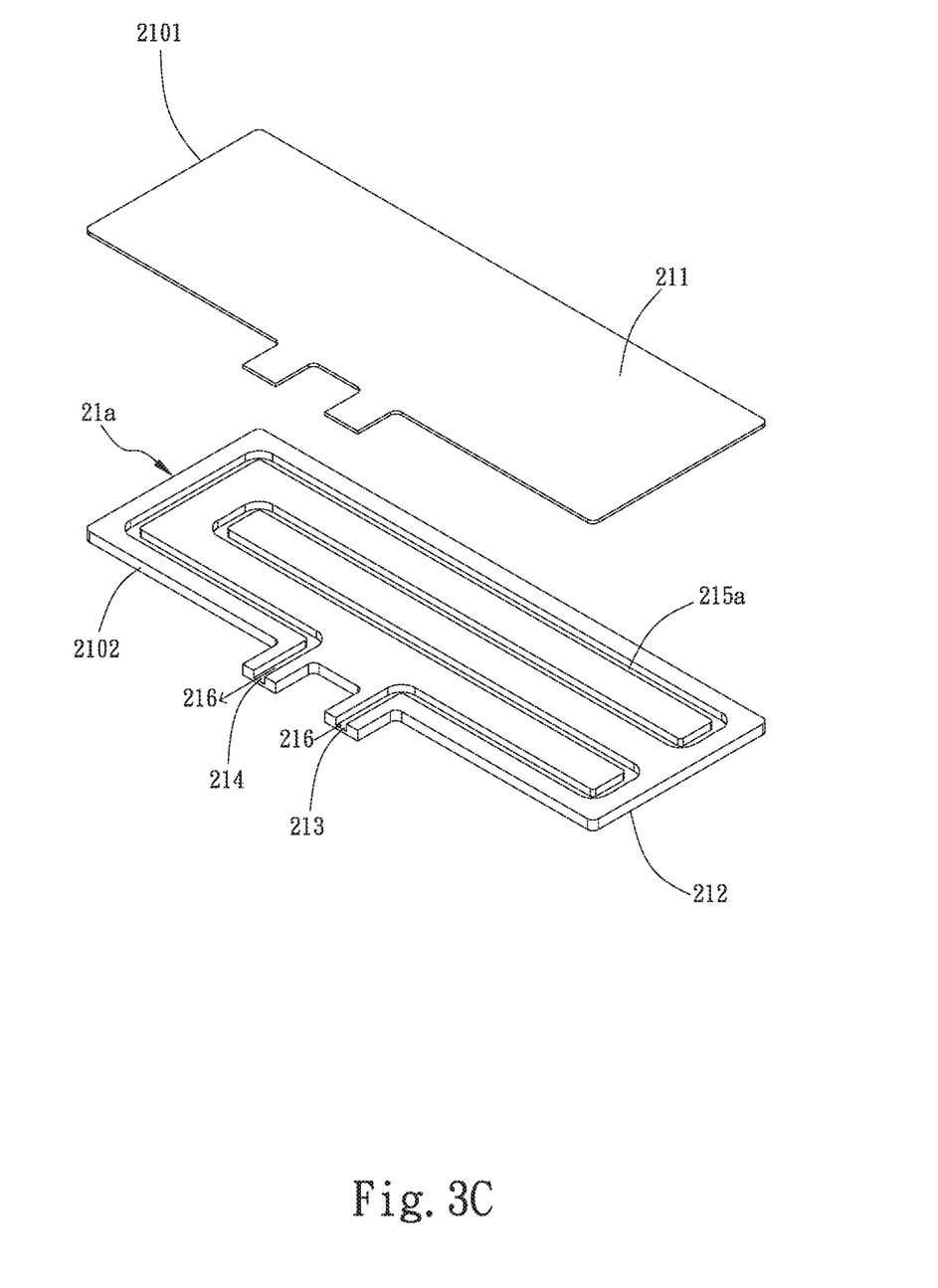
FIG. 3C is a top exploded perspective view of a variation of the cooling plate according to the preferred embodiment of the present invention.

FIG. 3C is a top exploded perspective view of a cooling plate 21a, which is a variation of the cooling plate 21 according to the preferred embodiment of the present invention. In this variation, the cooling plate 21a includes a first upper plate member 2101 and a first lower plate member 2102, which are closed to each other, and a liquid flowing section 215a. In this variation, the first upper surface 211 is formed on the first upper plate member 2101 and the first lower surface 212 is formed on the first lower plate member 2102, the liquid flowing section 215a is a guide groove formed between the first upper plate member 2101 and the first lower plate member 2102, and has two ends forming the inlet 213 and the outlet 214, respectively. In the illustrated variation, the liquid flowing section 215a is formed on one side of the first lower plate member 2102 facing toward the first upper plate member 2101. Again, the liquid flowing section 215a is winding through and accordingly, distributed over the entire first lower plate member 2102. With the winding liquid flowing section 215a, the time the first working liquid 216 flows through the liquid flowing section 215a is extended, which allows heat carried by the first working liquid 216 to be uniformly transferred to the cooling plate 21a.

Figure 4A:
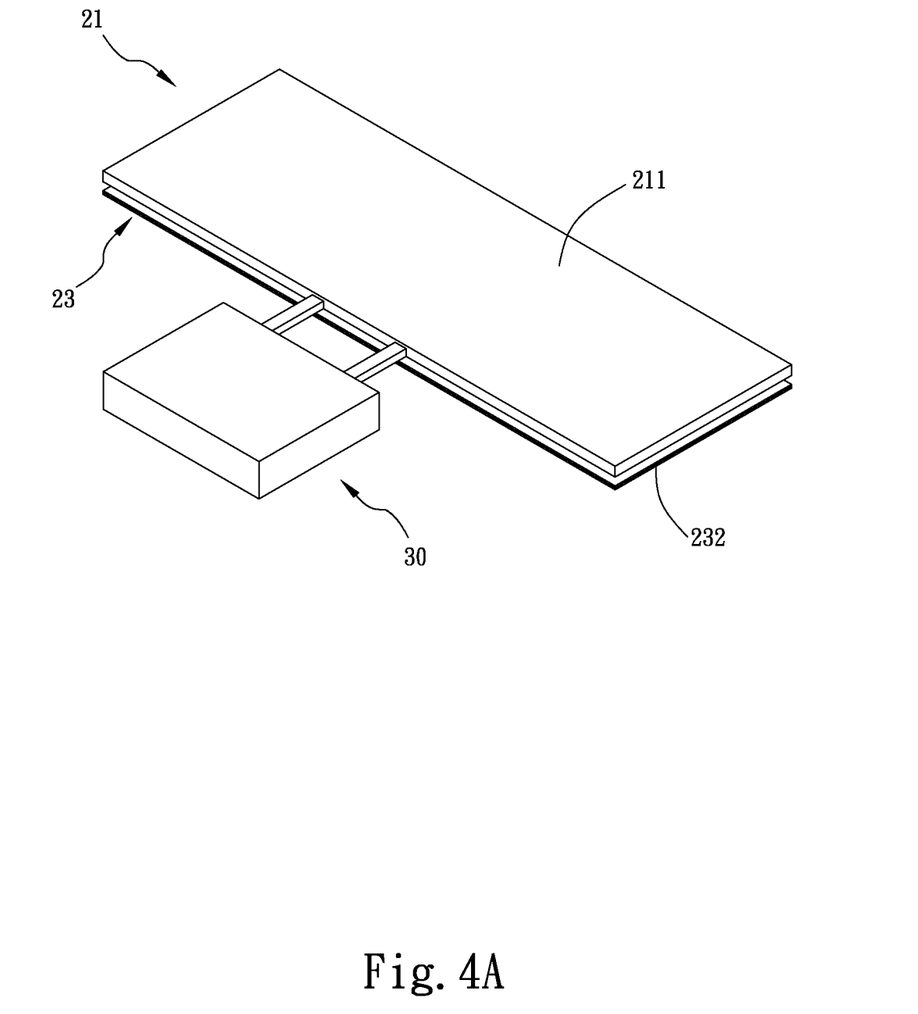
FIGS. 4A and 4B show the composite water-cooling radiator structure according to the preferred embodiment of the present invention and the alternative embodiment thereof, respectively, are connected to a water block module.
Figure 4B:
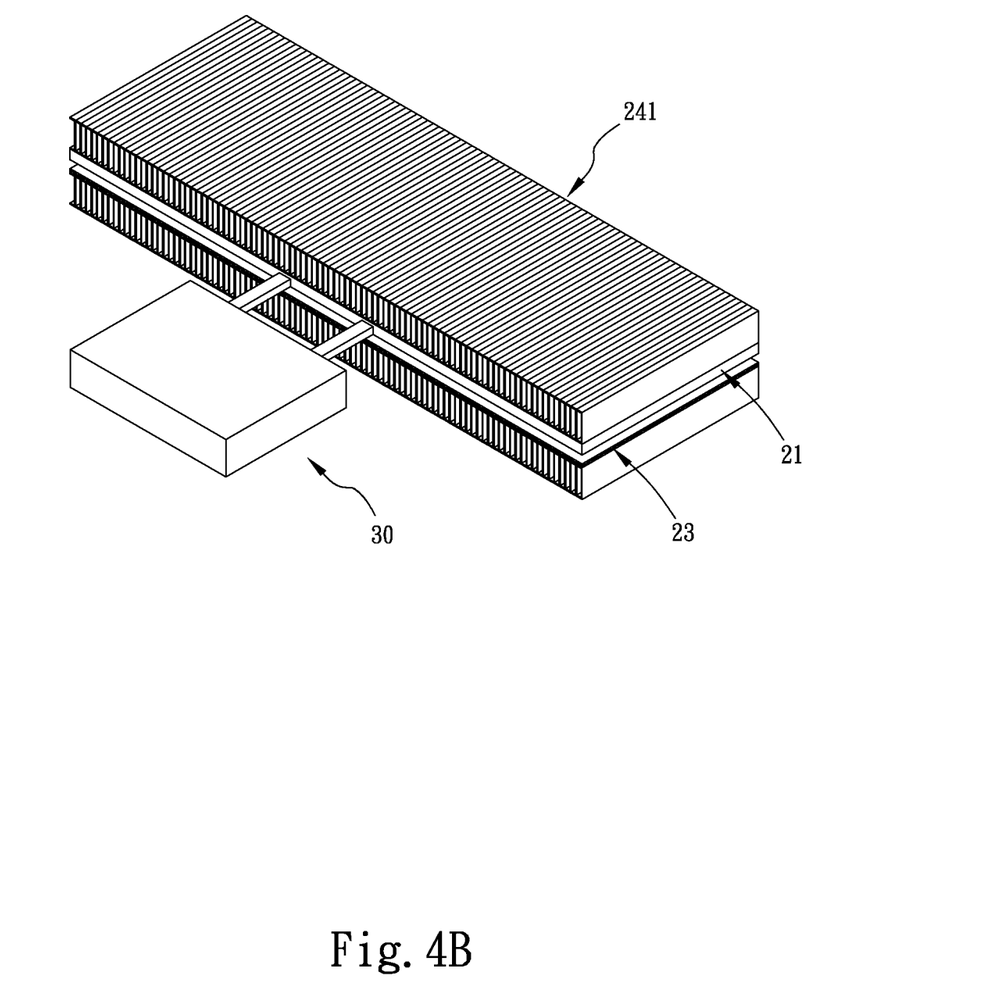
Figure 4C:
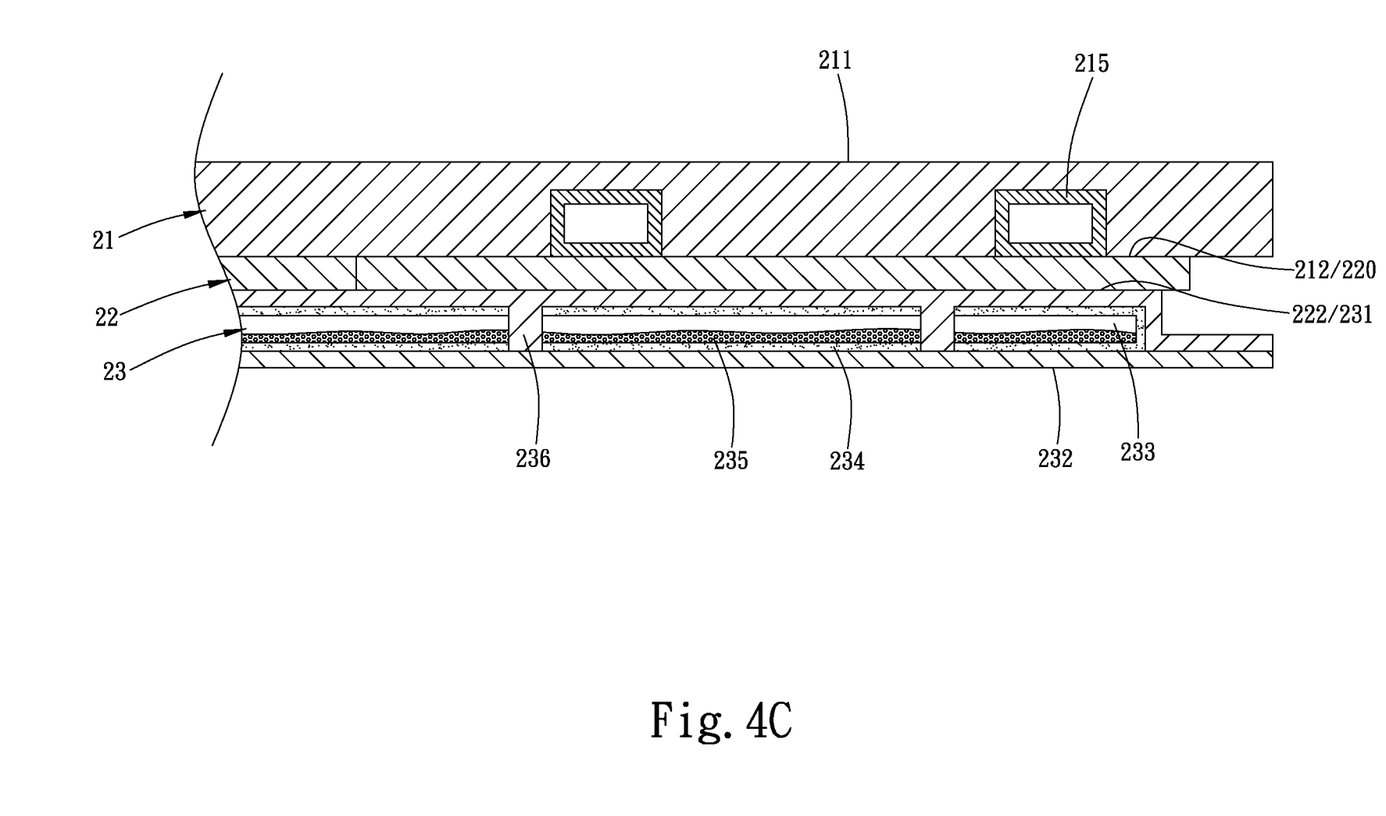
FIG. 4C is a fragmentary sectional view of FIG. 4A.
Figure 4D:
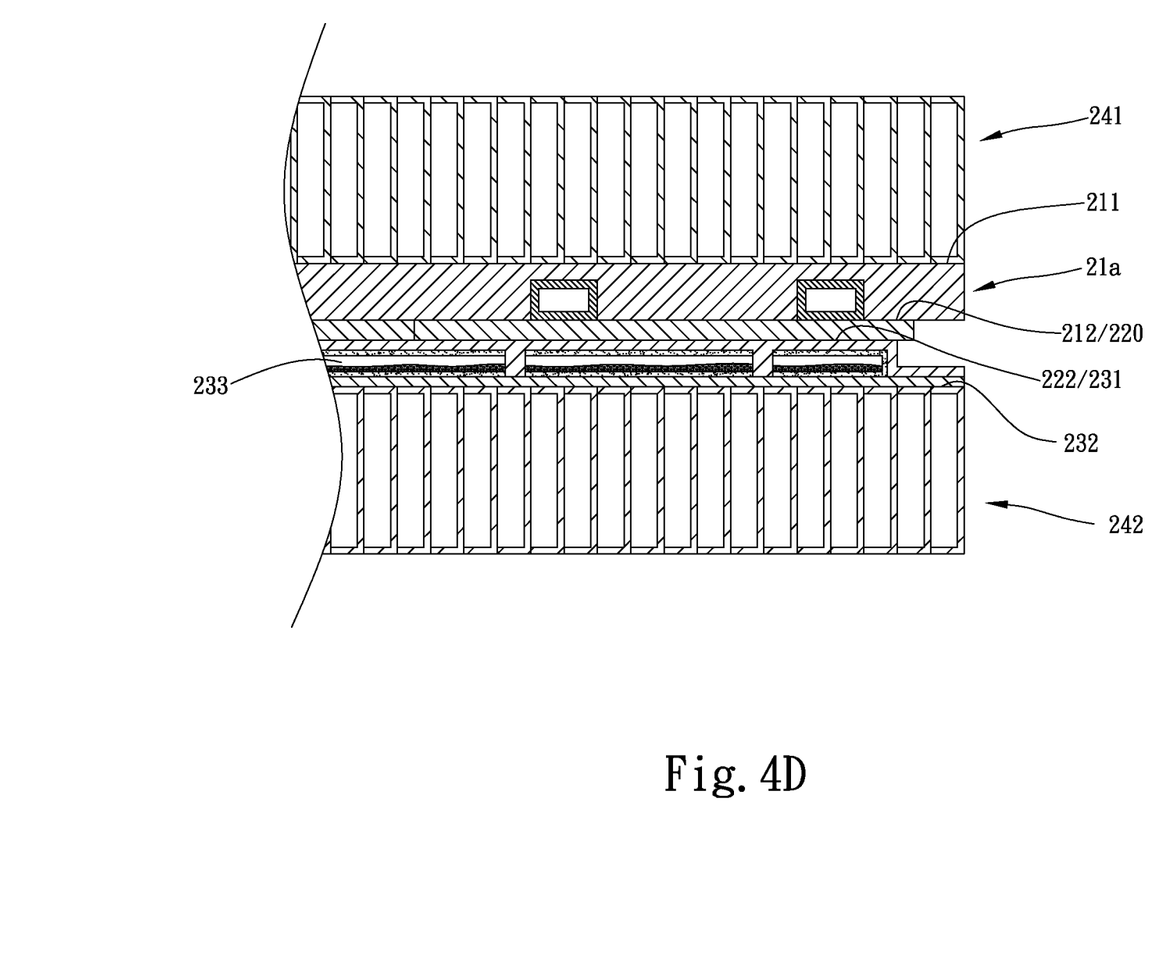
FIG. 4D is a fragmentary sectional view of FIG. 4B.

FIGS. 4A and 4B show the composite water-cooling radiator structure 20 according to the preferred embodiment of the present invention and the alternative embodiment thereof, respectively, are connected to a water block module 30; and FIGS. 4C and 4D are fragmentary section views of FIGS. 4A and 4B, respectively. Please refer to FIGS. 4A, 4B, 4C and 4D along with FIGS. 2A, 2B, 2C, 3A, 3B and 3C. The inlet 213 and the outlet 214 of the cooling plate 21 of the composite water-cooling radiator structure 20 are communicably connected to a water block module 30, which can include, for example, a water block and a pump as described in the section of Background of the Invention. The pump can be mounted inside or outside the water block. The first working liquid 216 in the liquid flowing section 215, 215a flows into the water block module 30 via the outlet 214 to exchange heat with a heat-producing element and is therefore heated. The heated first working liquid 216 flows out of the water block module 30 and back into the cooling plate 21, 21a via the inlet 213. While the first working liquid 216 flows along the liquid flowing section 215, 215a toward the outlet 214, the heat carried by the first working liquid 216 is transferred to and homogeneously distributed over the cooling plate 21, 21a. In the case of a composite water-cooling radiator structure 20 according to the preferred embodiment of the present invention, as shown in FIG. 2A, the heat transferred to the first upper surface 211 of the cooling plate 21, 21a is dissipated into ambient air directly from the first upper surface 211, and the heat transferred to the first lower surface 212 of the cooling plate 21, 21a is absorbed by the cold end 221 of the cooling chip unit 22 and then transferred to the hot end 222, from where the heat is further transferred to the second upper surface 231 of the vapor chamber 23. The heat transferred to the second upper surface 231 is absorbed by the second working liquid 235 in the closed chamber 233 of the vapor chamber 23. The heated second working liquid 235 circulates in the closed chamber 233 to change between a gas phase and a liquid phase. When the second working liquid 235 is in the gas phase, heat carried by the second working liquid 235 is transferred to the second lower surface 232 to dissipate into ambient air.

On the other hand, in the case of a composite water-cooling radiator structure 20 according to the alternative embodiment of the present invention, as shown in FIG. 2C, the heat transferred to the first upper surface 211 of the cooling plate 21, 21a is dissipated into ambient air from the first radiation fin assembly 241, and the heat transferred to the second lower surface 232 of the vapor chamber 23 is dissipated into ambient air from the second radiation fin assembly 242.

What is to be noted is the cooling plate 21, 21a, the liquid flowing section 215, 215a, the vapor chamber 23, the first radiation fin assembly 241 and the second radiation fin assembly 242 are made of a metal material, such as gold, silver, copper, iron, titanium, stainless steel, or any alloy thereof. Among others, titanium is high in metal strength and light in weight, and has good heat conducting efficiency to enable effectively upgraded thermal conductivity and reduced overall weight of the composite water-cooling radiator structure 20 of the present invention.

Figure 5:
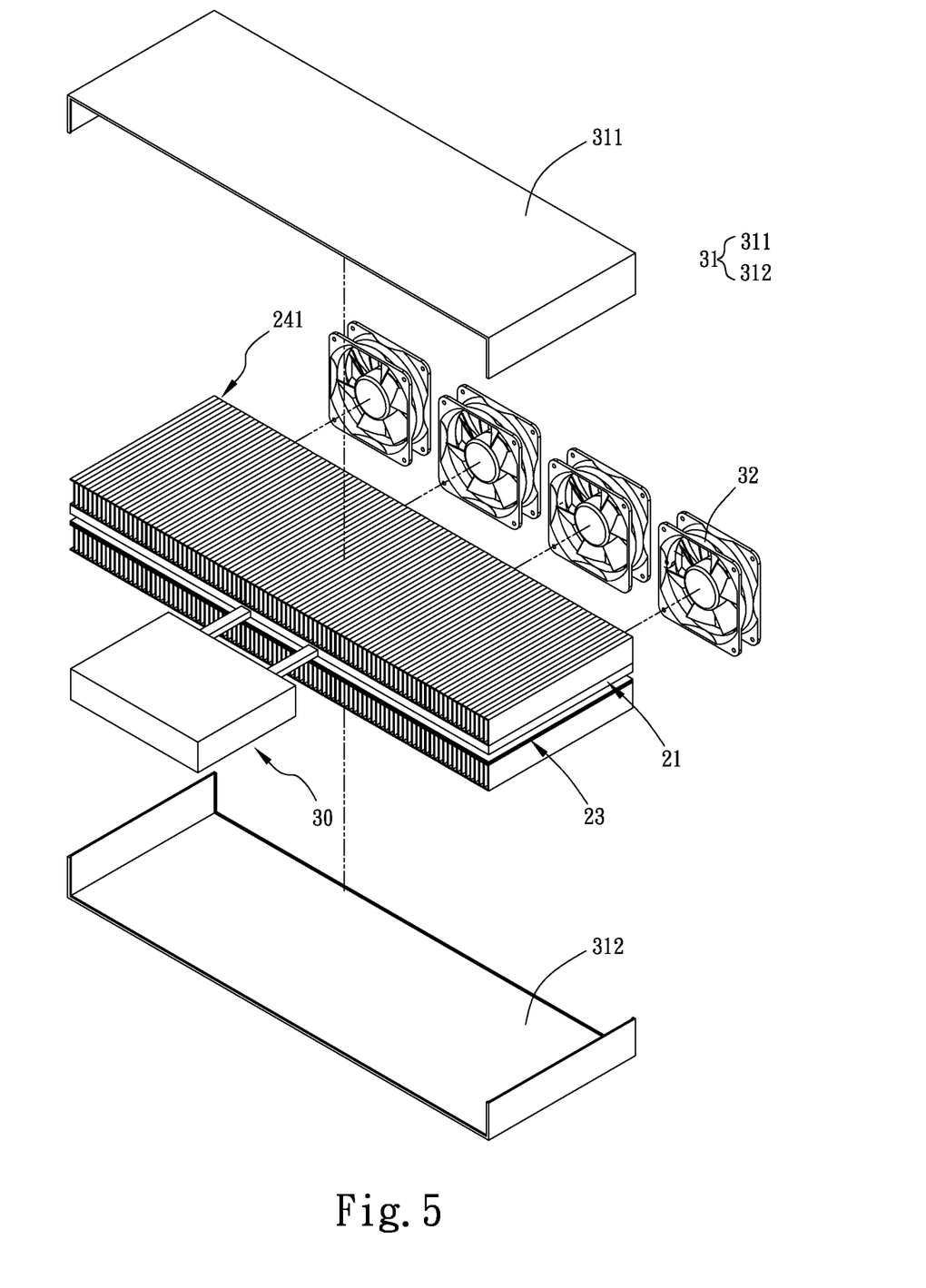
FIG. 5 shows the composite water-cooling radiator structure according to the alternative embodiment thereof can be further connected to a protection cover unit and at least one cooling fan after being connected to a water block module.

FIG. 5 shows the composite water-cooling radiator structure 20 according to the alternative embodiment thereof can be further connected to a protection cover unit 31 after being connected to a water block module 30. The protection cover unit 31 includes a first cover 311 and a second cover 312, which are covered onto a top and a bottom of the first and the second radiation fin assembly 241, 242, respectively, to protect the first and the second radiation fin assembly 241, 242 against damages. Further, at least one cooling fan 32 can be optionally connected to the protection cover unit 31 to facilitate good dissipation of heat from the first and the second radiation fin assembly 241, 242.

With the above arrangements, the composite water-cooling radiator structure 20 according to the preferred embodiment of the present invention and the alternative embodiment thereof are compact in volume, have reduced thermal resistance, and provide upgraded heat dissipation performance because the cooling chip unit 22 can efficiently transfer heat from the cooling plate 21, 21a to the vapor chamber 23 and to the first and second radiation fin assemblies 241, 242, which provide increased air contact areas of the cooling plate 21, 21a and the vapor chamber 23, respectively.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A composite water-cooling radiator structure, comprising:
   a cooling plate having a first upper surface and a first lower surface; a liquid flowing section, through which a first working liquid flows; and an inlet and an outlet communicating with the liquid flowing section;
   a cooling chip unit being located beneath the cooling plate and having a cold end and a hot end to serve as a heat transfer path; and the cold end being in contact with the first lower surface of the cooling plate to absorb a heat from the first lower surface and to transfer the heat to the hot end;
   a vapor chamber being located beneath the cooling chip unit and having a second upper surface and a second lower surface; and the second upper surface being in contact with the hot end of the cooling chip unit, and the heat being transferred from the hot end of the cooling chip unit to the second upper surface of the vapor chamber, and the heat being dissipated into ambient air.

2. The composite water-cooling radiator structure as claimed in claim 1, wherein the first upper surface and the first lower surface are located at two opposite sides of the cooling plate, and one of the first upper surface and the first lower surface is formed with a groove, in which the liquid flowing section is set.

3. The composite water-cooling radiator structure as claimed in claim 2, wherein the liquid flowing section is a liquid guide pipe having two ends that form the inlet and the outlet, respectively.

4. The composite water-cooling radiator structure as claimed in claim 1, wherein the cooling plate includes a first upper plate member and a first lower plate member, which are closed to each other; the first upper surface being formed on the first upper plate member and the first lower surface being formed on the first lower plate member; and the liquid flowing section being a guide groove formed between the first upper plate member and the first lower plate member, and having two ends that form the inlet and the outlet, respectively.

5. The composite water-cooling radiator structure as claimed in claim 1, wherein the cooling chip unit includes one or more cooling chips, which are arranged side by side in a row.

6. The composite water-cooling radiator structure as claimed in claim 1, wherein the inlet and the outlet are connected to a water block module, which includes a water block and a pump.

7. The composite water-cooling radiator structure as claimed in claim 1, wherein the vapor chamber internally has a closed chamber for receiving a second working liquid and a wick structural layer therein; and the wick structural layer being situated on one inner wall surface of the closed chamber.

8. The composite water-cooling radiator structure as claimed in claim 7, wherein the closed chamber is internally provided with at least one supporting post.

9. The composite water-cooling radiator structure as claimed in any one of claim 1, wherein the cooling plate is provided on the first upper surface with a first radiation fin assembly and the vapor chamber is provided on the second lower surface with a second radiation fin assembly.

10. The composite water-cooling radiator structure as claimed in claim 9, wherein the first and the second radiation fin assembly are connected to a protection cover unit, which is connected to at least one cooling fan.

* * * * *